United States Patent [19]

Haferl

[11] 4,177,392

[45] Dec. 4, 1979

[54] CURRENT SWITCHING NETWORKS

[75] Inventor: Peter E. Haferl, Zurich, Switzerland

[73] Assignee: RCA Corporation, New York, N.Y.

[21] Appl. No.: 840,394

[22] Filed: Oct. 7, 1977

Related U.S. Application Data

[62] Division of Ser. No. 757,375, Jan. 6, 1977, Pat. No. 4,081,721.

[30] Foreign Application Priority Data

Feb. 4, 1976 [GB] United Kingdom ............... 04406/76

[51] Int. Cl.² ........................ H03K 17/00; H03K 5/04
[52] U.S. Cl. ................................ 307/254; 307/296 R; 330/257; 330/288; 307/297
[58] Field of Search .................. 307/296 R, 297, 254, 307/263, 353; 323/4; 330/257, 261, 288

[56] References Cited

U.S. PATENT DOCUMENTS

| 3,973,215 | 8/1976 | Ahmed | 307/297 |
| 4,047,057 | 9/1977 | Ahmed | 307/273 |

Primary Examiner—Stanley D. Miller, Jr.
Assistant Examiner—B. P. Davis
Attorney, Agent, or Firm—Eugene M. Whitacre; Allen LeRoy Limberg; Allan J. Jacobson

[57] ABSTRACT

The current supplied by a constant current generator is selectively applied to the unilaterally conductive input circuit of a current amplifier and otherwise flows through other unilaterally conductive means. The current amplifier provides current flow through its output circuit only when current is applied to its input circuit.

13 Claims, 5 Drawing Figures

CURRENT SWITCHING NETWORKS

The present application is a divisional application based on U.S. patent application Ser. No. 757,375, filed Jan. 6, 1977 and entitled "Conduction Overlap Control Circuit for Switched Output Stages", now U.S. Pat. No. 4,081,721, issued Mar. 28, 1978.

The present invention relates to current switching networks.

In a current switching network embodying the present invention current supplied from a constant current generator is selectively applied to the unilaterally conductive input circuit of a current amplifier and otherwise flows through other unilaterally conductive means. The current amplifier provides output current flow through its output circuit only when current is applied to its input circuit.

In the drawing:

Each of FIGS. 1 and 3 is a schematic diagram of a current switching network of this type wherein the current amplifier comprises a simple transistor;

Figure 1:
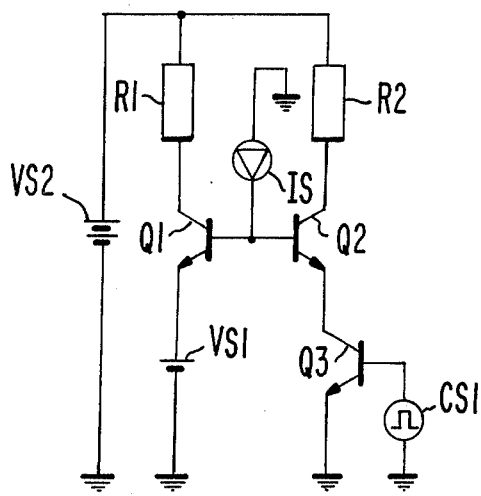

Referring to FIG. 1, a constant current generator IS has a first terminal which supplies current to an interconnection between the base electrodes of transistors Q1 and Q2. IS has a second terminal connected to ground reference potential, through which the supplied current is returned. (A constant current generator supplies a current which may be of fixed or of changing value, but which has a value that is substantially unaffected by changes in the potential at its connection to succeeding circuitry. The constant current generator exhibits a high source impedance to succeeding circuitry so the potential between the generator and the succeeding circuitry is free to assume the values imposed by the operation of the succeeding circuitry.)

The base-emitter junction of Q1 is in series connection with a voltage supply VS1, which series connection provides a unilaterally conductive means conductive only when the potential thereacross exceeds a threshold potential. VS1 is the potential offsetting means by which this threshold potential is made to exceed the sum of the emitter-to-base voltage, or $V_{BE}$, of transistor Q2 and the saturation voltage, or $V_{SAT}$, of a keying transistor Q3 when it is placed into saturated conduction responsive to forward-bias current or potential applied between its emitter and base electrodes by a control signal generator CS1. For purposes of explaining the present invention, Q2 may be considered to be a current amplifier having input, output and common connections at its base, collector and emitter electrodes, respectively. The input circuit Q2 presents between its input and common connections has characteristics necessary to the operation of the present invention; namely, Q2 is unilaterally conductive from the input to common connection and the potential at the input connection is clamped to the potential at the common connection during unilateral conduction of current. Keying transistor Q3 functions as a means for selectively connecting this input circuit across the constant current generator IS whenever control signal generator CS1 renders Q3 conductive between its collector and emitter electrodes. Using Q3 to complete the connection of the emitter electrode of Q3 to the second, grounded terminal of constant current generator IS, and connecting the base electrode of Q3 directly to the first terminal of IS is advantageous since control signal can be applied single-ended to Q3 without flowing in transistor Q2, thereby avoiding any need for a floating source of control signal. If control signal source CS1 does not apply sufficient positive potential to the base electrode of Q3 to drive it into conduction, Q3 presents a high collector impedance to the emitter electrode of Q2. Q2 in turn presents a high base impedance to the current generator IS as compared to the base impedance presented by Q1, which has its emitter electrode connected to ground reference potential via a low-impedance direct voltage source VS1. Consequently, substantially all the current supplied by current generator IS is steered to flow as base current to Q1, responsive to which Q1 withdraws collector current from a direct voltage supply VS2 through a collector load R1 having a direct current conductive path therethrough. Q2 remains non-conductive and withdraws no collector current from supply VS2 through its collector load R2, which also has a direct current conductive path therethrough.

On the other hand, if control signal source CS1 does apply sufficient positive potential to the base electrode of Q3 to drive it into saturated conduction, the emitter potential of Q2 is drawn towards ground reference potential. The base potential of Q2 is forced to follow its emitter potential because of the clamping property of the base-emitter junction of Q2. This reverse-biases the base-emitter junction of Q1, so the base impedance presented by Q1 to current generator IS becomes high compared to the base impedance presented by Q2. Consequently, substantially all the current supplied by IS is steered to flow as base current to Q2, responsive to which Q2 withdraws collector current from voltage supply VS2 through collector load R2. Q1 is rendered nonconductive and withdraws no collector current from voltage supply VS2.

The constant current generator IS can take a variety of forms, the constant current being supplied, for example, from the collector electrode of a transistor of a conductivity type complementary to that of Q1 and Q2. In such an embodiment of IS saturation of the complementary conductivity transistor does not occur.

The clamping of the interconnection of the base electrodes of Q1 and Q2 by the base-emitter junction of Q1, absent the clamping provided by the base-emitter junction of Q2 when Q3 is conductive, maintains the potential at the interconnection of the base electrodes of Q1 and Q2 at a well-defined potential with respect to ground.

Figure 2:
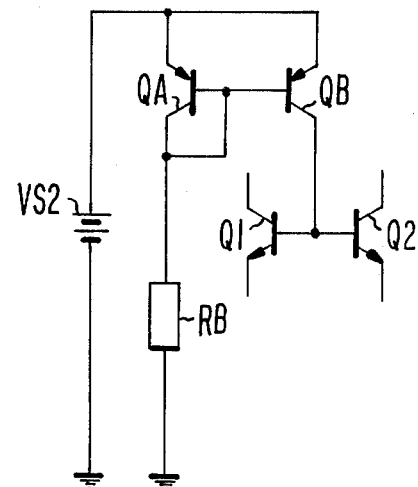
FIG. 2 is a schematic diagram of how current source IS may be realized.

FIG. 2 is a representative form of the constant current generator IS. QA and QB are connected in current mirror amplifier configuration CMA. CMA is supplied input current via a bleeder resistor RB and responds with an output current from the collector of QB.

Figure 3:
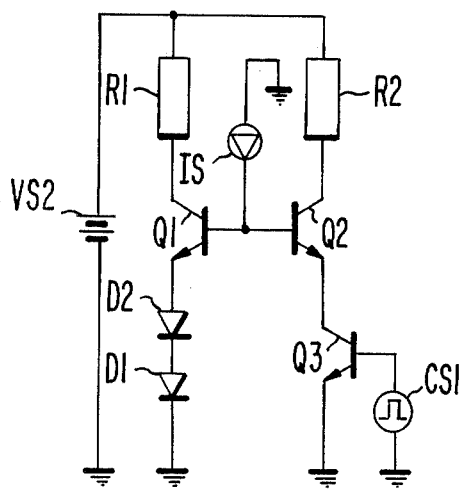

As shown in FIG. 3, the means providing an offset voltage between ground reference potential and the emitter electrode of Q1 may be conveniently provided by one or more offset diodes D1, D2 connected in the path between ground reference potential and the emitter electrode of Q1, rather than by an independent voltage supply VS1. The use of more than one diode better guarantees negligible conduction of Q1 when Q3 saturates to pull the emitter electrode of Q2 close to ground. An alternative solution is to forward-bias a reduced number of offset diodes via an auxiliary direct current conductive path through a bleeder resistor connected to the positive terminal of supply VS2.

Figure 4:
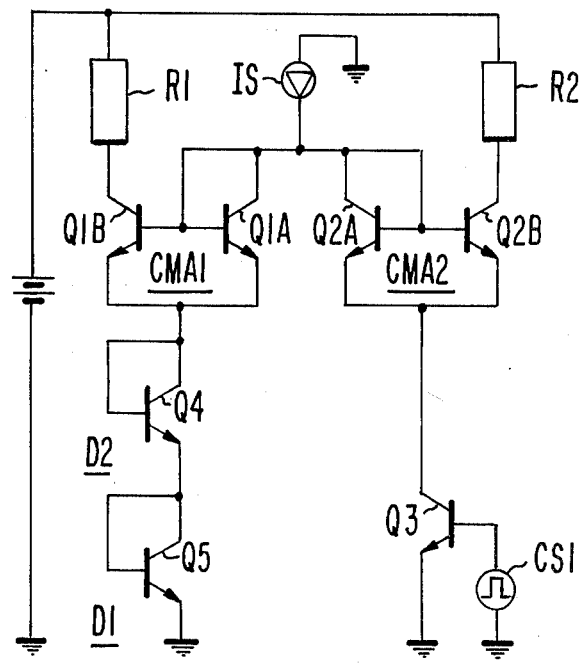
FIG. 4 is a schematic diagram of a current switching network embodying the present invention and using current mirror amplifiers as current amplifier elements.

The configurations thus far described share the problem that the currents they alternatively supply to load R1 or to load R2 are not in well-defined proportion to the current supplied by current generator IS, but rather are larger than this current by the common-emitter forward current gains, or betas, of Q1 and Q2. Transistor beta changes with temperature and as a function of the manufacturing steps used to make the transistor. Also, the configurations thus far described cannot be built using field effect, rather than junction transistors, since there must be clamping between the input and common connections of the transistor for the current steering mechanism to work. These problems can be overcome as shown in FIG. 4; wherein Q1 is replaced by a current mirror amplifier (or "CMA") configuration CMA1 comprising master and slave transistors Q1A and Q1B, respectively; wherein Q2 is replaced by a current mirror amplifier configuration CMA2 comprising master and slave transistors Q2A and Q2B, respectively; and wherein semiconductor diode means D1 and D2 consist of transistors Q4 and Q5, respectively, each self-biased by direct-coupled collector-to-base feedback. (Self-biased transistors Q1A and Q2A may also be viewed as functioning as semiconductor diode means.) Each CMA has input and output connections to which the collector electrodes of its master and slave transistors respectively connect and a common connection to which the emitter electrodes of both of its master and slave transistors connect. Each master transistor is provided with direct-coupled collector-to-base feedback to condition it to accept input current applied between the input and common connections of the CMA, which feedback connection provides for clamping between the input and common connections of the CMA. When Q3 is biased into saturation, transistor Q2B will demand a current related to that supplied by current generator IS in the same ratio as the collector-current-versus-emitter-to-base voltage ($I_C$ vs. $V_{BE}$) characteristic of Q2B is related to that of Q2A, that is, in a ratio equal to the current gain of CMA2. When Q3 is biased for non-conduction, transistor Q1B will demand a current related to that supplied by current source IS in the same ratio as the $I_C$ vs. $V_{BE}$ characteristic of Q1B to that of Q1A—that is, in a ratio equal to the current gain of CMA1.

The FIG. 4 configuration may be modified by rearranging the order of the self-biased transistors Q1A, Q4 and Q5 in their series connection. Each of the transistors Q1A, Q1B, Q2A, Q2B, Q3, Q4 and Q5 in the FIG. 4 configuration may be replaced by an enhancement mode field effect transistor of similar conductivity type. If one requires only that a single current be selectively caused to flow, rather than two currents to be alternatively caused to flow, one may modify the FIG. 4 configuration omitting R1 and Q1B.

Switching of CMA's in accordance with the present invention is advantageous in that—unlike certain other switched CMA configuration known to applicant—the base-to-base and emitter-to-emitter connections of the master and slave transistors are not disturbed by the switching procedure. Accordingly, there is no interference with the close matching of the emitter-to-base potentials, which close matching underlies the predictability of the CMA current gain.

Figure 5:
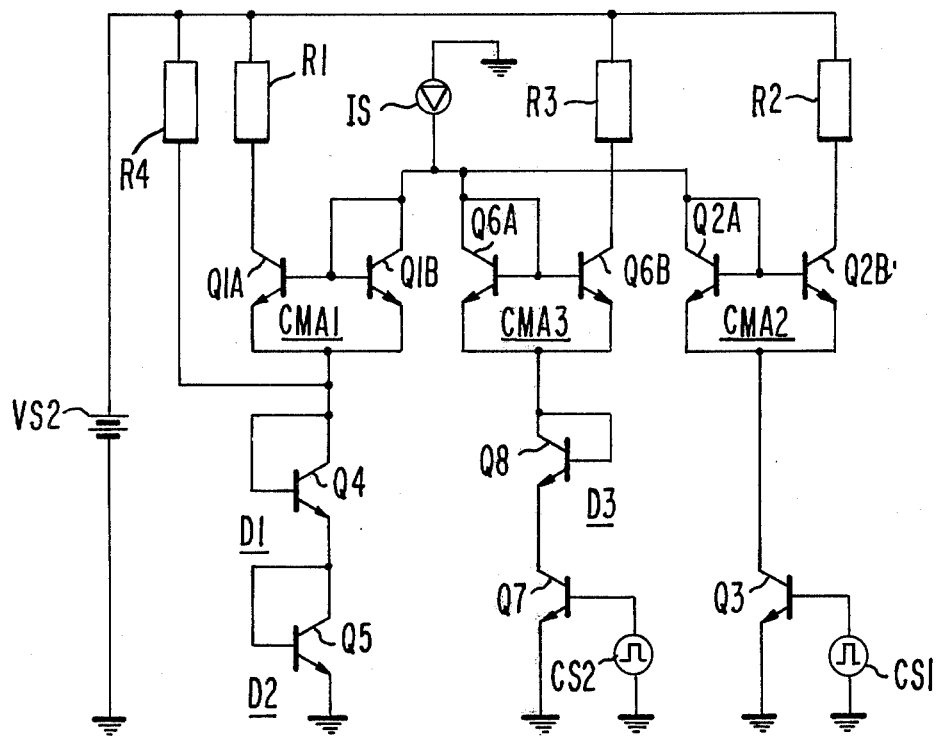
FIG. 5 is a schematic diagram illustrating how the principles of the present invention may be applied to more complex current switching networks.

The principles of the present invention can be extended to more complex structures as exemplified by FIG. 5. In FIG. 5, so long as control signal generators CS1 and CS2 do not apply positive base potentials to either of the keying transistors Q3 and Q7, the only CMA biased into conduction is CMA1. So long as control signal source CS1 supplies sufficiently positive base potential to Q3 to bias it into saturation, the clamping action of self-biased transistor Q2A steers all of the current supplied by current generator IS to the input connection of CMA2, causing an output current larger by the current gain of CMA2 to be withdrawn through the output connection of CMA2 and through R2. This is so even if control signal generator CS2 biases transistor Q7 for conduction since the low potential appearing at the interconnected input connections of current mirror amplifiers CMA1, CMA2, and CMA3 is clamped to the emitter-to-base offset voltage ($V_{BE}$) across Q2A plus the saturation voltage ($V_{SAT}$) of Q3. This potential is so low that it will not support conduction through the serially connected self-biased transistors Q6A and Q8 even when transistor Q7 is biased for conduction, nor will it support conduction through the serially connected self-biased transistors Q1B, Q4 and Q5. A bleeder resistor R4 supplies additional forward bias current to D1 and D2 to turn off of Q1A and Q1B in CMA1. Turn-off is assured when the potential at the interconnection of CMA1 and CMA2 is clamped to a $2V_{BE}+V_{SAT}$ potential by saturated conduction of Q7.

If control signal source CS1 does not bias transistor Q3 into conduction and control signal source CS2 does bias Q7 into saturated condition, the clamping action of self-biased transistors Q6A and Q8 will lower the potential at the interconnected input connections of CMA1, CMA2 and CMA3 sufficiently that CMA1 will be biased out of conduction. Q3 not being biased into conduction, there is no path for current flow through the input circuit of CMA2, so CMA2 will be out of conduction. The current from IS consequently is steered through the self-biased master transistor Q6A of CMA3, the diode means D3 provided by self-biased transistor Q8, and the saturated keying transistor Q7. The slave transistor Q6B of CMA3 withdraws a current through its collector load R3, which load has a direct current conductive path therethrough. The amplitude of this current is related to that of the current supplied by IS in the same ratio as the $I_C$ vs. $V_{BE}$ characteristics of Q6B is related to those of Q6A.

The present invention may be constructed replacing the simple CMA's shown with other CMA's, of which several types are known, so long as they are of a type in which the input and common connections are clamped together responsive to application of current to the input circuit between these connections.

What is claimed is:
1. A current switching network comprising:
   a constant current generator having first and second terminals between which current is supplied;
   a first current amplifier having input and output and common connections, said first current amplifier being of a type exhibiting unilateral conduction from its input connection to its common connection through a unilaterally conductive input circuit therebetween and having its input connection clamped to its common connection during such unilateral conduction so their departure in potential does not exceed a predetermined value;

means for selectively connecting the input circuit of said first current amplifier for unilateral conduction between the first and second terminals of said constant current generator;

unilaterally conductive means connected between the first and second terminals of said constant current generator for selectively conducting that portion of the current supplied by said constant current generator as does not flow to the input circuit of said first current amplifier, said unilaterally conductive means being of a type conductive only when the potential thereacross exceeds a threshold value, which threshold value is chosen larger than said predetermined value plus any potential drop exhibited by said means for selectively connecting the input circuit of said current amplifier; and means connected between the common and output connections of said first current amplifier for extracting a first output current flowing in response to the selective connection of the input circuit of said first current amplifier between the first and second terminals of said constant current generator.

2. A current switching network as set forth in claim 1 wherein said means for selectively connecting the input circuit of said first current amplifier between the first and second terminals of said constant current generator includes:

a continuous uninterrupted connection of the input connection of said first current amplifier to the first terminal of said constant current generator;

a second current amplifier having input and output and common connections, its output connection being to the common connection of said first current amplifier and its common connection being to the second terminal of said constant current generator; and a control signal generator for selectively applying a control signal between the common and input connections of said second current amplifier.

3. A current switching network as set forth in claim 1 including:

a second current amplifier having input and output and common terminals and having an input circuit between its input and common terminals;

potential offsetting means connected in a series connection with the input circuit of said second current amplifier, which series connection corresponds to said unilaterally conductive means; and means connected between the common and output connections of said second current amplifier for extracting a second output current flowing in response to the absence of the selective connection of the input circuit of said first current amplifier between the first and second terminals of said constant current generator.

4. A current switching network as set forth in claim 3 wherein said means for selectively connecting the input circuit of said current amplifier between the first and second terminals of said constant current generator includes:

a continuous uninterrupted connection of the input connection of said current amplifier to the first terminal of said constant current generator;

a third current amplifier having input and output and common connections, its output connection being to the common connection of said first current amplifier and its common connection being to the second terminal of said constant current generator; and a control signal generator for selectively applying a control signal between the common and input connections of said third current amplifier.

5. A current switching network comprising:

means for supplying a reference potential and first and second operation potentials;

first and second and third transistors of the same conductivity type, each having base and emitter and collector electrodes, the emitter electrode of said second transistor having the collector electrode of said third transistor connected thereto, and the emitter electrode of said third transistor being connected to said reference potential;

means for applying said first operating potential to the collector electrode of said first transistor and means for applying said second operating potential to the collector electrode of said second transistor, at least one of which means for applying operating potential includes signal utilization means;

constant current generator means for applying current to an interconnection of the base electrodes of said first and said second transistors, which current is of the polarity said first or said second transistor may conduct as base current;

control signal generator means for selectively applying a control signal between the emitter and base electrodes of said third transistor of sufficient magnitude to bias said third transistor into saturated conduction, under which conditions the current from said constant current generator means tends to flow as base current to said second transistor rather than as base current to said first transistor;

means for applying a potential to the emitter electrode of said first transistor, which potential is between said reference potential and said first operating potential and sufficiently removed from said reference potential to inhibit conduction of said first transistor when said third transistor is in saturated conduction.

6. A current switching network as set forth in claim 5 wherein said means for applying a potential to the emitter electrode of said first transistor includes at least one semiconductor diode means connected in a path between the emitter electrode of said first transistor and said reference potential and poled for conducting the emitter current of said first transistor.

7. A current switching network as set forth in claim 6 wherein each of said first and said second transistors has a respective further semiconductor diode means connected between its base and emitter electrodes in such poling as to conduct simultaneously therewith.

8. A current switching network as set forth in claim 5 wherein each of said first and said second transistors has a respective semiconductor diode means connected between its base and emitter electrodes in such poling as to conduct simultaneously therewith.

9. A current switching network comprising:

supply means for supplying a reference potential at a first terminal thereof and for supplying an operating potential at a second terminal thereof;

a first current mirror amplifier having input and output and common connections, having an input circuit between its input and common connections that is unilaterally conductive of a particular polarity of current from the input connection to the common connection, and being of the type responsive to unilateral conduction of current through its input circuit to clamp the potential at its input connection to the potential at its common connection so the departure in potential between these connections does not exceed a first predetermined value;

unilaterally conductive means having first and second terminals and being of a type that unilaterally conducts current between its first and second terminals only when the potential therebetween exceeds a threshold value appreciably larger than said first predetermined value, the second terminal of said unilaterally conductive means being connected to the first terminal of said supply means;

constant current generator means for applying current of said particular polarity to an interconnection between the input connection of said first current mirror amplifier and the first terminal of said unilaterally conductive means;

electrically controlled switch means selectively connecting the common connection of said first current mirror amplifier to the first terminal of said supply means, for selectively applying said reference potential to the common connection of said first current mirror amplifier thereby to divert the current supplied from said constant generator means from said unilaterally conductive means, through which said current otherwise flows, to the input circuit of said first current mirror amplifier; and first load means for receiving the current appearing at the output connection of said first current mirror amplifier responsive to flow of current through its input circuit, said load means including a direct current conductive path between the second terminal of said supply means and the output connection of said first current mirror amplifier.

10. A current switching network as set forth in claim 9 wherein said unilaterally conductive means comprises the serial connection of a plurality of semiconductor diode means.

11. A current switching network as set forth in claim 9 including:
a second current mirror amplifier having input and output and common connections, having an input circuit between its input and common connections that is conductive of current of said particular polarity from the input connection to the common connection and that is included in said unilaterally conductive means, and being of the type responsive to unilateral conduction of current through its input circuit to clamp the potential at its input connection to the potential at its common connection so the departure in potential between these connections does not exceed a second predetermined value; and
second load means for receiving the current appearing at the output connection of said second current mirror amplifier in response to flow of current through its input circuit, said second load means including a direct current conductive path between the second terminal of said supply means and the output connection of said second current mirror amplifier.

12. A current switching network as set forth in claim 9 including:
a second current mirror amplifier having input and output and common connections, having an input circuit between its input and common connections that is conductive of current of said particular polarity from the input connection to the common connection, and being of the type responsive to unilateral conduction of current through its input circuit to clamp the potential at its input connection to the potential at its common connection so the departure in potential between these connections does not exceed a second predetermined value;
at least one semiconductor diode means in series connection with the input circuit of said second current mirror amplifier, which series connection corresponds to said unilaterally conductive means; and
second load means for receiving the current appearing at the output connection of said second current mirror amplifier in response to flow of current through its input circuit, said second load means including a direct current conductive path between the second terminal of said supply means and the output connection of said second current mirror amplifier.

13. A current switching network as set forth in claim 9 wherein said unilaterally conductive means includes:
a second current mirror amplifier having input and output and common connections, having an input circuit between its input and common connections that is conductive of current of said particular polarity from the input connection to the common connection, and being of the type responsive to unilateral conduction of current through its input circuit to clamp the potential at its input connection to the potential at its common connection so the departure in potential between these connections does not exceed a second predetermined value;
an interconnection of the input connections of said first and second current mirror amplifiers;
at least one semiconductor diode means connected in a path between the common connection of said second current mirror amplifier and the first terminal of said supply means, thereby to form a series connection with the input circuit of said second current mirror amplifier which series connection corresponds to said unilateral conductive means; and
second load means for receiving the current appearing at the output connection of said second current mirror amplifier in response to flow of current through its input circuit, said load means including a direct current conductive path between the second terminal of said supply means and the output connection of said second current mirror amplifier.

* * * * *